(12) United States Patent
Kobayashi et al.

(10) Patent No.: US 7,190,204 B2
(45) Date of Patent: Mar. 13, 2007

(54) LOGICAL CIRCUIT

(75) Inventors: Hiroyuki Kobayashi, Kawasaki (JP); Masaki Okuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/042,335

(22) Filed: Jan. 26, 2005

(65) Prior Publication Data

US 2005/0168245 A1    Aug. 4, 2005

Related U.S. Application Data

(63) Continuation of application No. PCT/JP03/03030, filed on Mar. 13, 2003.

(51) Int. Cl.
*H03H 11/16* (2006.01)

(52) U.S. Cl. ............ 327/239; 327/259

(58) Field of Classification Search ............ None
See application file for complete search history.

(56) References Cited

U.S. PATENT DOCUMENTS 5,440,250 A * 8/1995 Albert ............ 326/97
5,874,845 A * 2/1999 Hynes ............ 327/259
5,955,906 A * 9/1999 Yamaguchi ............ 327/259
6,307,416 B1 * 10/2001 Heyne et al. ............ 327/259
6,489,826 B2 * 12/2002 Truong et al. ............ 327/259
6,798,248 B2 * 9/2004 Hazucha et al. ............ 326/93

FOREIGN PATENT DOCUMENTS

| JP | 06097815 A | 4/1994 |
| JP | 08-088545 | 4/1996 |
| JP | 11068551 A | 3/1999 |

OTHER PUBLICATIONS

English translation of relevant portions of Japanese Office Action issued Jul. 7, 2006 in corresponding Japanese application No. 2004-569356.

* cited by examiner

*Primary Examiner*—Timothy P. Callahan
*Assistant Examiner*—Cassandra Cox
(74) *Attorney, Agent, or Firm*—Arent Fox PLLC (57) ABSTRACT

A logical circuit receives first and second input signals in which a period of a first logic level partially overlaps, and outputs first and second output signals in which a period of the first logic level does not overlap. The logical circuit comprises a first unit which changes a phase of the first output signal from a second logic level to the first logic level when a change of the first input signal from the second logic level to the first logic level is detected. A second unit changes a phase of the second output signal from the first logic level to the second logic level when the second input signal is detected as being at the first logic level at a time of detection of the change of the first input signal.

7 Claims, 7 Drawing Sheets

|         | t1 | t2  | t3  | t4  | t5  |
|---------|----|-----|-----|-----|-----|
| INPUT A | L  | L→H | L   | H→L | L   |
| INPUT B | H  | H   | H→L | L   | L→H |
| a       | H  | H→L | L   | L→H | H   |
| b       | L  | L   | L   | L   | L   |
| c       | H  | H→L | L→H | H   | H   |
| d       | L  | L→H | H→L | L   | L   |
| e       | H  | H   | H→L | L   | L→H |
| f       | H  | H   | H→L | L   | L→H |
| g       | L  | L   | L→H | H   | H→L |
| OUTPUT C| L  | L→H | H   | H→L | L   |

FIG.6C

|         | t1 | t2  | t3  | t4  | t5  |
|---------|----|-----|-----|-----|-----|
| INPUT A | L  | L→H | H   | H→L | L   |
| INPUT B | H  | H   | H→L | L   | L→H |
| h       | L  | L   | L→H | H   | H→L |
| i       | L  | L→H | H→L | L   | L   |
| j       | H  | H→L | L→H | H   | H   |
| k       | L  | L→H | H→L | L   | L   |
| l       | L  | L→H | H   | H→L | L   |
| m       | L  | L   | L→H | H→L | L   |
| n       | H  | H   | H→L | L→H | H   |
| OUTPUT D| H  | H→L | L   | L   | L→H |

LOGICAL CIRCUIT

CROSS-REFERENCE TO RELATED APPLICATION

This application is a U.S. continuation application which is filed under 35 USC 111(a) and claims the benefit under 35 USC 120 and 365(c) of International Application No. PCT/JP2003/03030, filed on Mar. 13, 2003, the entire contents of which are hereby incorporated by reference.

BACKGROUND OF THE INVENTION

1. Field of the Invention

The present invention relates to a logical circuit which is carried on a semiconductor device and outputs the output signals in which the period of the logic level (H) does not overlap even when the logical circuit receives the input signals in which the period of the logic level (H) partially overlaps.

2. Description of the Related Art

As a logical circuit which outputs the signals in which the period of the logic level (H) does not overlap, the EX-OR (exclusive-or) circuit is well known.

In a case of the EX-OR circuit, the output signal will be influenced by one of the input signals at the time of rising of the other of the input signals.

This is a significant problem for a certain circuit, such as a DLL (delay-locked loop) circuit in which the timing of rising of the signals is important. In a semiconductor device carrying the circuit which operates at a high speed synchronized with the clock signal, a variation of phase in the clock signal may arise due to signal transmission delay or the like.

When a logical circuit which outputs the signals in which the period of the logic level (H) does not overlap is added to the semiconductor device and used together in order to reduce such phase variation of the clock signal as much as possible, consideration must be taken on the conformity of the logical circuit with the circuit in which the timing of rising of the signals is important.

For this reason, it is demanded to provide a logical circuit which outputs the signals in which the period of the logic level (H) does not overlap and can be used suitably with the circuit, such as the DLL circuit in which the timing of rising of the signals is important, in such a manner that rising of the signal is not affected but falling of the signal is affected.

Figure 1A:
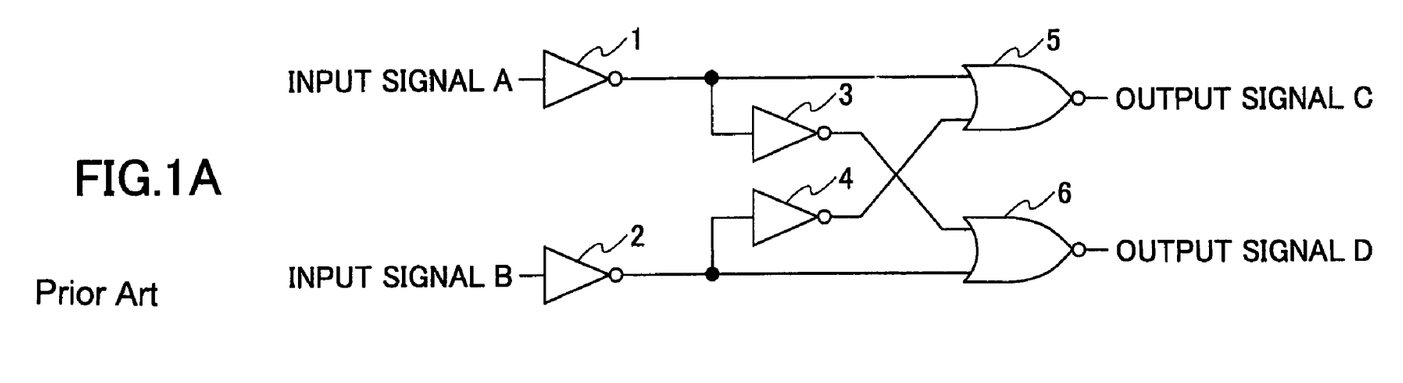
FIG. 1A is a circuit diagram showing the conventional logical circuit.
Figure 1B:
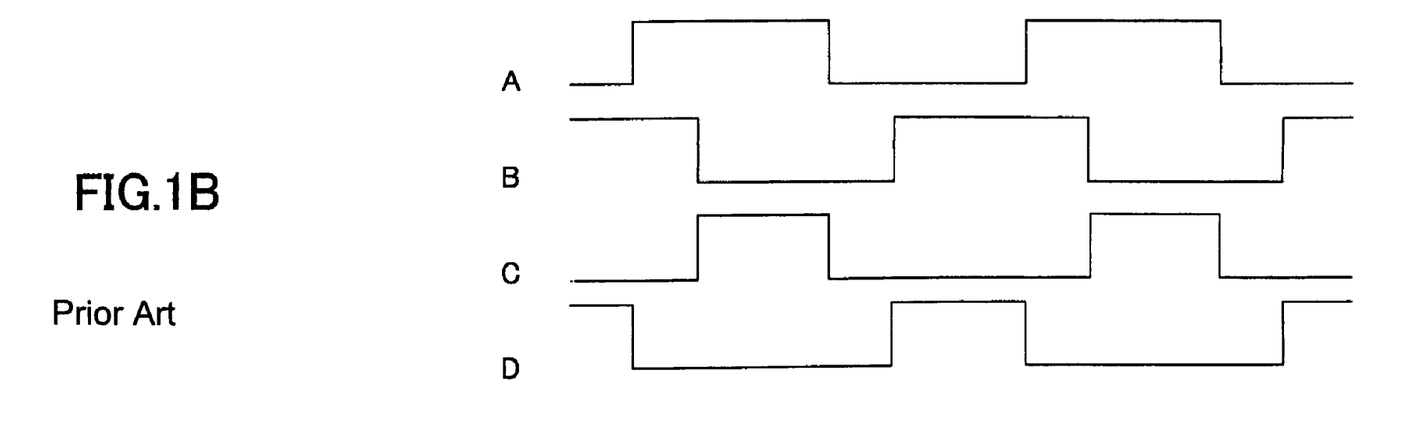
FIG. 1B is a waveform diagram showing the signal waveform of the input signals A and B to the logical circuit of FIG. 1A, and the output signals C and D.

FIG. 1A shows an example of the conventional logical circuit. FIG. 1B shows the signal waveform of the input signals A and B to the logical circuit of FIG. 1A, and the output signals C and D from the logical circuit.

The logical circuit of FIG. 1A is a general EX-OR circuit that outputs the signals in which the period of the logic level (H) does not overlap.

The EX-OR circuit comprises the inverter 1, the inverter 2, the inverter 3, the inverter 4, the NOR gate 5, and the NOR gate 6.

In the EX-OR circuit of FIG. 1A, the input signal A is inputted to the inverter 1, and the input signal B is inputted to the inverter 2. The output of the inverter 1 is inputted to one input of the NOR gate 5 while it is inputted to the inverter 3. The output of the inverter 2 is inputted to one input of the NOR gate 6 while it is inputted to the inverter 4.

The output of the inverter 3 is inputted to the other input of the NOR gate 6. The output of the inverter 4 is inputted to the other input of the NOR gate 5. The NOR gate 5 receives the outputs from the inverter 1 and the inverter 4 and outputs the output signal C, and the NOR gate 6 receives the outputs from the inverter 2 and the inverter 3 and outputs the output signal D.

Consideration will now be taken to the case where the phase of the input signal A and the input signal B is shifted somewhat with reference to FIG. 1B.

The input signal A and the input signal B are, for example, the two clock signals which have different phases.

To these input clock signals, the variation in the phase may arise due to transmission delay of the clock signals in the semiconductor device carrying the circuit which operates at the high speed synchronized with the clock signals.

As shown in FIG. 1B, when the input signal B is at the logic level (L) at the instant the input signal A has changed from the logic level (L) to the logic level (H) (the time of rising), the phase of the input signal A transfers to the phase the output signal C as it is.

However, when the input signal B is at the logic level (H) at the time of rising of the input signal A, the output signal C still remains at the logic level (L).

When the input signal B changes from the logic level (H) to the logic level (L), the phase of the input signal A transfers to the phase of the output signal C for the first time.

That is, the time of rising of the input signal A will be delayed until the phase of the input signal B changes to the logic level (L), and then the output signal C will be outputted.

In other words, the EX-OR circuit of FIG. 1A operates such that the portion in which the logic level (H) of the input signal A overlaps with the input signal B is deleted from the portion in which the phase is changed from the logic level (L) to the logic level (H), and the overlapping of the logic level (H) of the output signal is eliminated.

However, when the method of the EX-OR circuit is applied to the circuit like the DLL circuit in which the timing of rising is important, the delay of the timing of rising is affected by the counterpart signal, and excessive delay time (loss) may arise, which will become the factor which worsens the underflow of the DLL circuit (which indicates the circuit performance with the delay minimum value).

Figure 2:
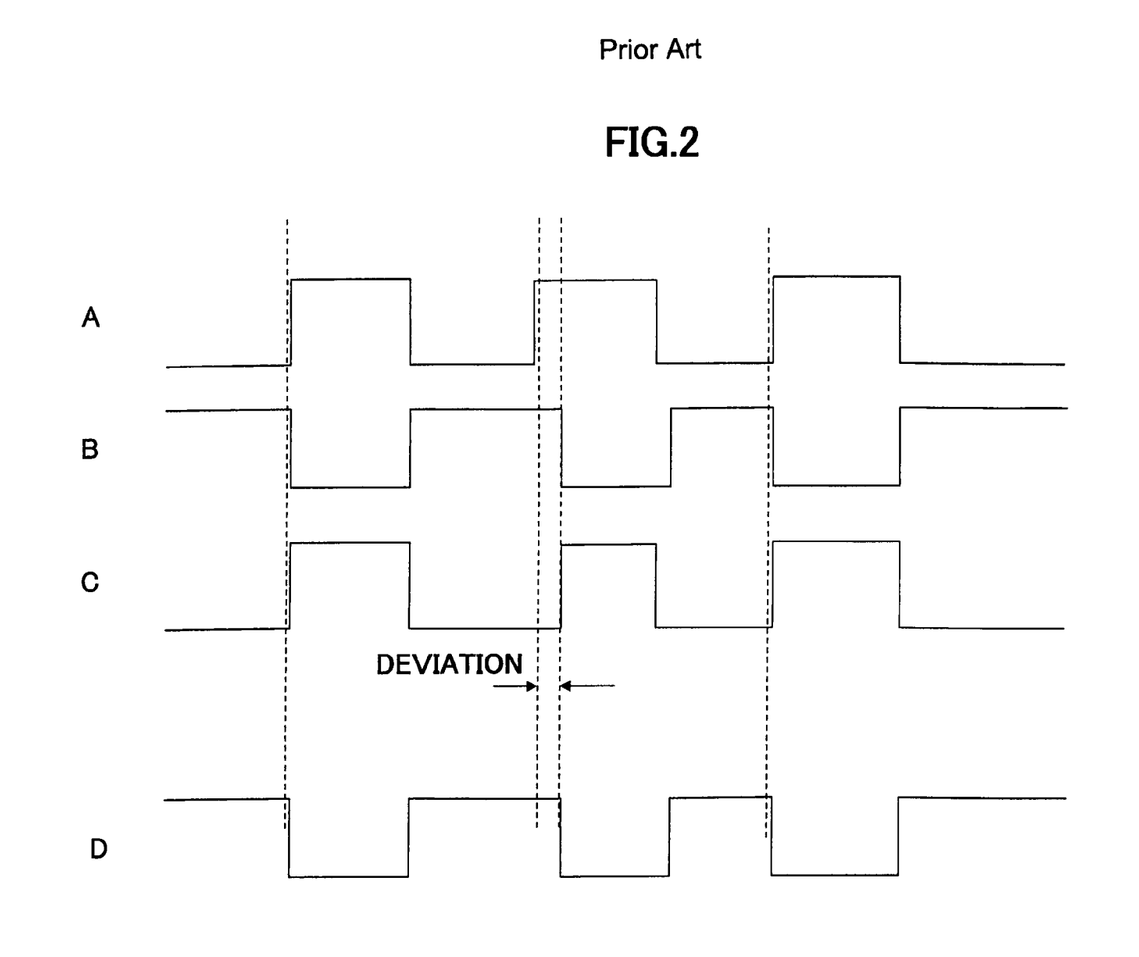
FIG. 2 is a diagram for explaining operation of the logical circuit of FIG. 1A.

Moreover, FIG. 2 is a diagram for explaining operation of the conventional logical circuit of FIG. 1A when the phase shift of the input signals occurs at intervals of the period of some cycles.

As shown in FIG. 2, when a phase shift of the input signal B to the input signal A occurs at intervals of some cycles, rather than the case where the phase shift occurs for every cycle, the conventional logical circuit may also cause the deviation of the phase of the input signal A.

SUMMARY OF THE INVENTION

An object of the present invention is to provide an improved logical circuit in which the above-described problems are eliminated.

Another object of the present invention is to provide a logical circuit which outputs the signals in which the period of the logic level (H) does not overlap and can be suitably used with a DLL circuit or the like in which the timing of rising is important, such that rising of the signals is not affected but falling of the signals is affected, In order to achieve the above-mentioned objects, the present invention provides a logical circuit which receives first and second input signals in which a period of a first logic level partially overlaps, and outputs first and second output signals in which a period of the first logic level does not overlap, the logical circuit comprising: a first unit which changes a phase of the first output signal from a second logic level to the first logic level when a change of the first input signal from the second logic level to the first logic level is detected; and a second unit which changes a phase of the second output signal from the first logic level to the second logic level when the second input signal is detected as being at the first logic level at a time of detection of the change of the first input signal.

As a logical circuit in which the period of the logic level (H) of the two output signals does not overlap, in the case of EX-OR circuit, the output signals will be influenced when one of the input signals is at the logic level (H) at a time of rising of the other input signal.

In the logical circuit of the present invention, rising of the signals is not influenced by the phase of the counterpart input signal. Therefore, according to the logical circuit of the present invention, it is possible to output the output signals in which the period of the logic level (H) does not overlap, without being influenced by either of the input signals at the time of rising of the counterpart input signal.

By applying the logical circuit of the present invention to the circuit like the DLL circuit in which the timing of rising of the signals is important, it is possible that outputting the signals in which the period of the logic level (H) does not overlap be guaranteed and excessive delay time be shortened, without being influenced due to fluctuation of the input signals at the time of rising of one of the input signals.

BRIEF DESCRIPTION OF THE DRAWINGS

Other objects, features and advantages of the present invention will be apparent from the following detailed description when read in conjunction with the accompanying drawings.

DETAILED DESCRIPTION OF PREFERRED EMBODIMENTS

A description will now be given of the preferred embodiments of the invention with reference to the accompanying drawings.

Figure 3:
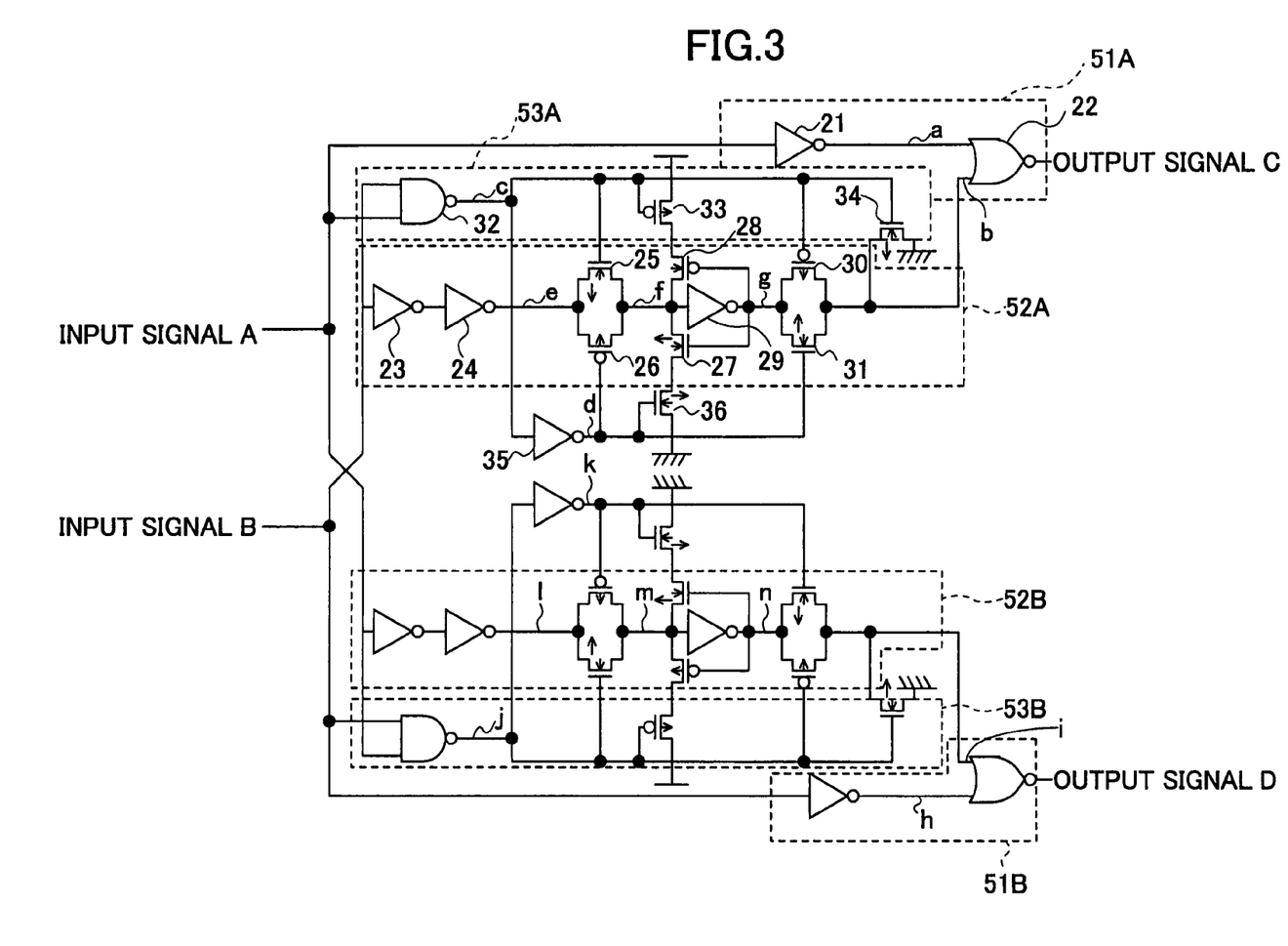
FIG. 3 is a circuit diagram showing the logical circuit in one embodiment of the invention.

FIG. 3 shows the logical circuit in one embodiment of the present invention.

In the logical circuit of FIG. 3, the circuit elements of the upper-side circuit block configured to output the output signal C and the circuit elements of the lower-side circuit block configured to output the output signal D are arranged symmetrically.

The upper-side circuit block of the logical circuit of FIG. 3 comprises the output unit 51A which outputs the output signal C, the circuit-element group 52A which transmits the input signal B, and the circuit-element group 53A which controls the transmission line (path) of the circuit-element group 52A based on the logic information of the input signal A and the counterpart input signal B.

The circuit-element group 52A and the circuit-element group 53A function as a state holding unit which holds, when the phase of the input signal A and the phase of the input signal B are set to the logic level (H) simultaneously, the state of the input signal B immediately preceding the setting.

Similarly, the lower-side circuit block of the logical circuit of FIG. 3 comprises the output unit 51B which outputs the output signal D, the circuit-element group 52B which transmits the input signal A, and the circuit-element group 53B which controls the transmission line (path) of the circuit-element group 52B by using the logic information of the input signal B and the counterpart input signal A.

The circuit-element group 52B and the circuit-element group 53B function as a state holding unit which holds, when the phase of the input signal A and the phase of the input signal B are set to the logic level (H) simultaneously, the state of the input signal A immediately preceding the setting.

As mentioned above, the circuit elements of the upper-side circuit block and the circuit elements of the lower-side circuit block in the logical circuit of this embodiment are the same, and, for the sake of convenience of description, only the circuit elements of the upper-side circuit block will be explained in the following, and a description of the lower-side circuit block will be omitted.

The circuit-element group 51A comprises the inverter 21 to which the input signal A is inputted, and the NOR gate 22 to which the output of the inverter 21 and the output of the circuit-element group 52A are inputted.

The circuit-element group 53A comprises the NAND gate 32 to which the input signal A and the input signal B are inputted, the transistor 33, and the transistor 34.

The transistor 33 has the gate to which the output of the NAND gate 32 is inputted, and the source-drain path one end of which is connected with the power-supply voltage line and the other end of which is connected with the source-drain path of the transistor 28.

The transistor 34 has the gate to which the output of the NAND gate 32 is inputted, and the source-drain path one end of which is grounded and the other end of which is connected with the output of the circuit-element group 52A.

The circuit-element group 52A comprises the inverter 23 to which the input signal B is inputted, the inverter 24 to which the output of the inverter 23 is inputted, the transistor 25, the transistor 26, the transistor 27, the transistor 28, the inverter 29, the transistor 30, and the transistor 31.

The transistor 25 and the transistor 26 have the respective source-drain paths which are connected with each other, one of the source-drain paths is connected to the output of the inverter 24, and the other of the source-drain paths is connected to the input of the inverter 29.

The transistor 25 has the gate to which the output of the NAND gate 32 is inputted. The transistor 26 has the gate to which the output of the inverter 35 is inputted.

Moreover, in the circuit-element group 52A, the transistor 28 has the gate to which the output of the inverter 29 is inputted, and the source-drain path one end of which is connected with the source-drain path of the transistor 33, and the other end of which is connected with the source-drain path of the transistor 27.

The transistor 27 has the gate to which the output of the inverter 29 is inputted, and the source-drain path one end of which is connected with the source-drain path of the transistor 36, and the other end of which is connected with the source-drain path of the transistor 28.

Moreover, in the circuit-element group 52A, the inverter 29 has the input which is connected with the source-drain path of the transistors 27 and 28, and the output which is connected with the source-drain path of the transistors 30 and 31.

The transistor 30 and the transistor 31 have the respective source-drain paths which are connected with each other, one of the source-drain paths is connected to the output of the inverter 29, and the other of the source-drain paths is connected to the source-drain path of the transistor 34.

The transistor 30 has the gate to which the output of the NAND gate 32 is inputted. The transistor 31 has the gate to which the output of the inverter 35 is inputted.

Furthermore, the upper-side circuit block of the logical circuit of FIG. 3 comprises the inverter 35 to which the output of the NAND gate 32 is inputted, and the transistor 36. The transistor 36 has the gate where the output of the inverter 35 is inputted, and the source-drain path one end of which is connected with the source-drain path of the transistor 27, and the other end of which is grounded.

As mentioned above, the lower-side circuit block of the logical circuit of FIG. 3 has the composition which is the same as the upper-side circuit block thereof. The lower-side circuit block comprises the output unit 51B which outputs the output signal D, the circuit-element group 52B which transmits the input signal A, and the circuit-element group 53B which controls the transmission line (path) of the circuit-element group 52B based on the logic information of the input signal B and the counterpart input signal A.

Figure 6A:
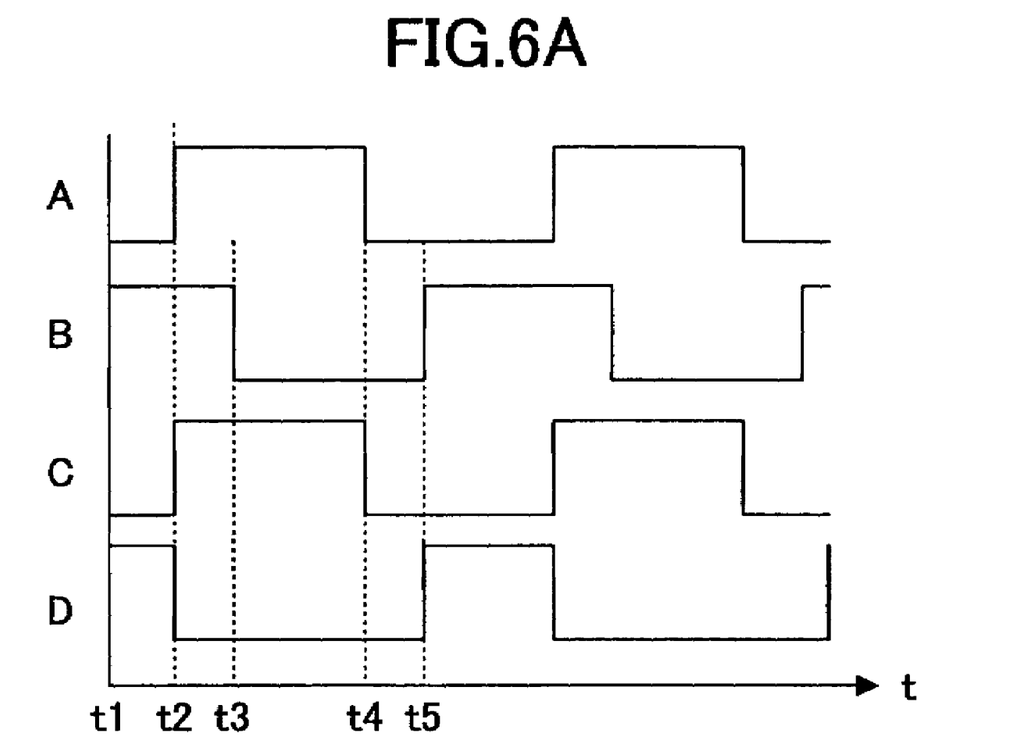
FIG. 6A is a waveform diagram showing the signal waveform of the input signals A and B to the logical circuit of FIG. 3, and the output signals C and D.
Figure 6B:
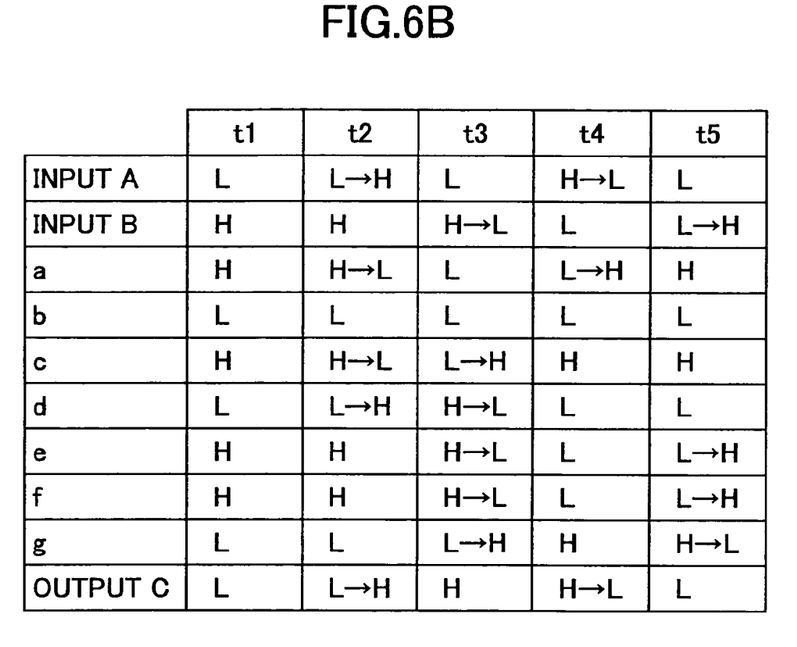
FIG. 6B is a diagram for explaining operation of the logical circuit of FIG. 3 at the time of outputting the output signal C to the input signals A and B.
Figure 6C:
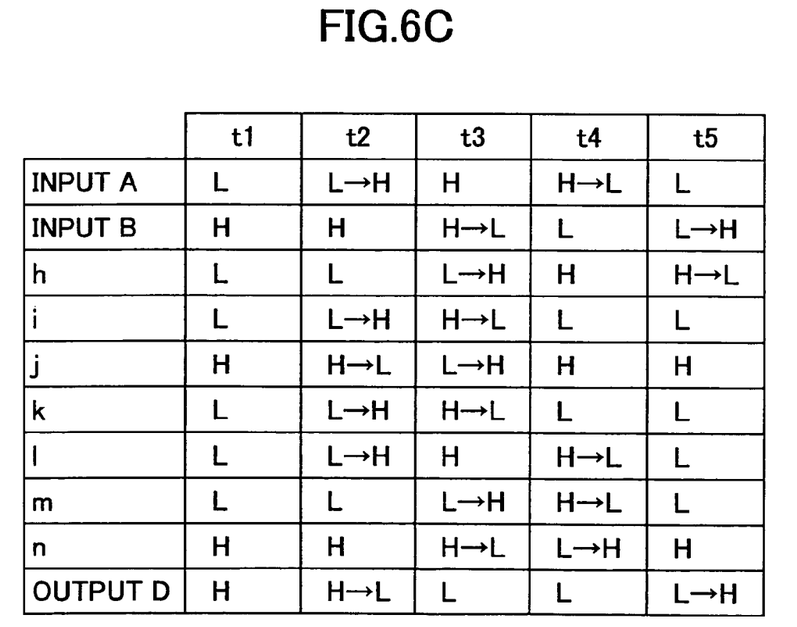
FIG. 6C is a diagram for explaining operation of the logical circuit of FIG. 3 at the time of outputting the output signal D to the input signals A and B.

FIG. 6A shows the signal waveform of the input signals A and B to the logical circuit of FIG. 3, and the output signals C and D. FIG. 6B is a diagram for explaining operation of the logical circuit of FIG. 3 at the time of outputting the output signal C responsive to the input signals A and B. FIG. 6C is a diagram for explaining operation of the logical circuit of FIG. 3 at the time of outputting the output signal D responsive to the input signals A and B.

In FIG. 6B and FIG. 6C, t1, t2, t3, t4, and t5 respectively indicate the instants which are the same as the corresponding timings of the input/output signals in the signal waveform of FIG. 6A which are designated by the same reference numerals. In FIG. 6B, a, b, c, d, e, f, and g respectively indicate the nodes which are the same as the corresponding nodes in the upper-side circuit block of the logical circuit of FIG. 3 which are designated by the same reference numerals.

Moreover, in FIG. 6C, h, i, j, k, l, m, and n respectively indicate the nodes which are the same as corresponding nodes in the lower-side circuit block of the logical circuit of FIG. 3 which are designated by the same reference numerals.

As is apparent from the signal waveform of FIG. 6A, at the time of t1, the input signal A is at the logic level (L), and the input signal B is at the logic level (H).

At the time of t2, the input signal A rises to the logic level (H), and both the phase of the input signal A and the phase of the input signal B are set to the logic level (H) simultaneously.

At the time of t3, the input signal B falls to the logic level (L), and the input signal A still remains at the logic level (H).

At the time of t4, the input signal A falls to the logic level (L), and the input signal B still remains at the logic level (L).

At the time of t5, the input signal B rises to the logic level (H), and the input signal A still remains at the logic level (L).

As shown in FIG. 6A, when the phase of the input signal A is changed from the logic level (L) to the logic level (H) (at the time of t2), the logical circuit of FIG. 3 functions to transfer the phase of the input signal A to the phase of the output signal C as it is, even if the counterpart input signal B is still at the logic level (H).

On the other hand, when the phase of the counterpart input signal B is changed from the logic level (H) to the logic level (L) (at the time of t3), the output signal D is still at the logic level (L). And the phase of the input signal B is not transferred to the phase of the output signal D. The position of falling of the output signal relative to the input signal will be shifted.

As mentioned above, in the EX-OR circuit of FIG. 1A, rising of one input signal is influenced by the counterpart input signal and falling is not influenced. On the other hand, in the logical circuit of the present invention, rising is not influenced by the counterpart input signal, but falling is influenced by the state of the counterpart input signal.

According to the logical circuit of the present invention, excessive delay time can be shortened without being influenced due to fluctuation of the input signals at the time of rising of one of the input signals. When it is applied to the circuit like the DLL circuit in which the timing of rising is important, the logical circuit of the invention is very useful because the two output signals in which the period of the logic level (H) does not overlap are outputted while rising of one of the input signals is not influenced by the counterpart input signal.

Figure 4:
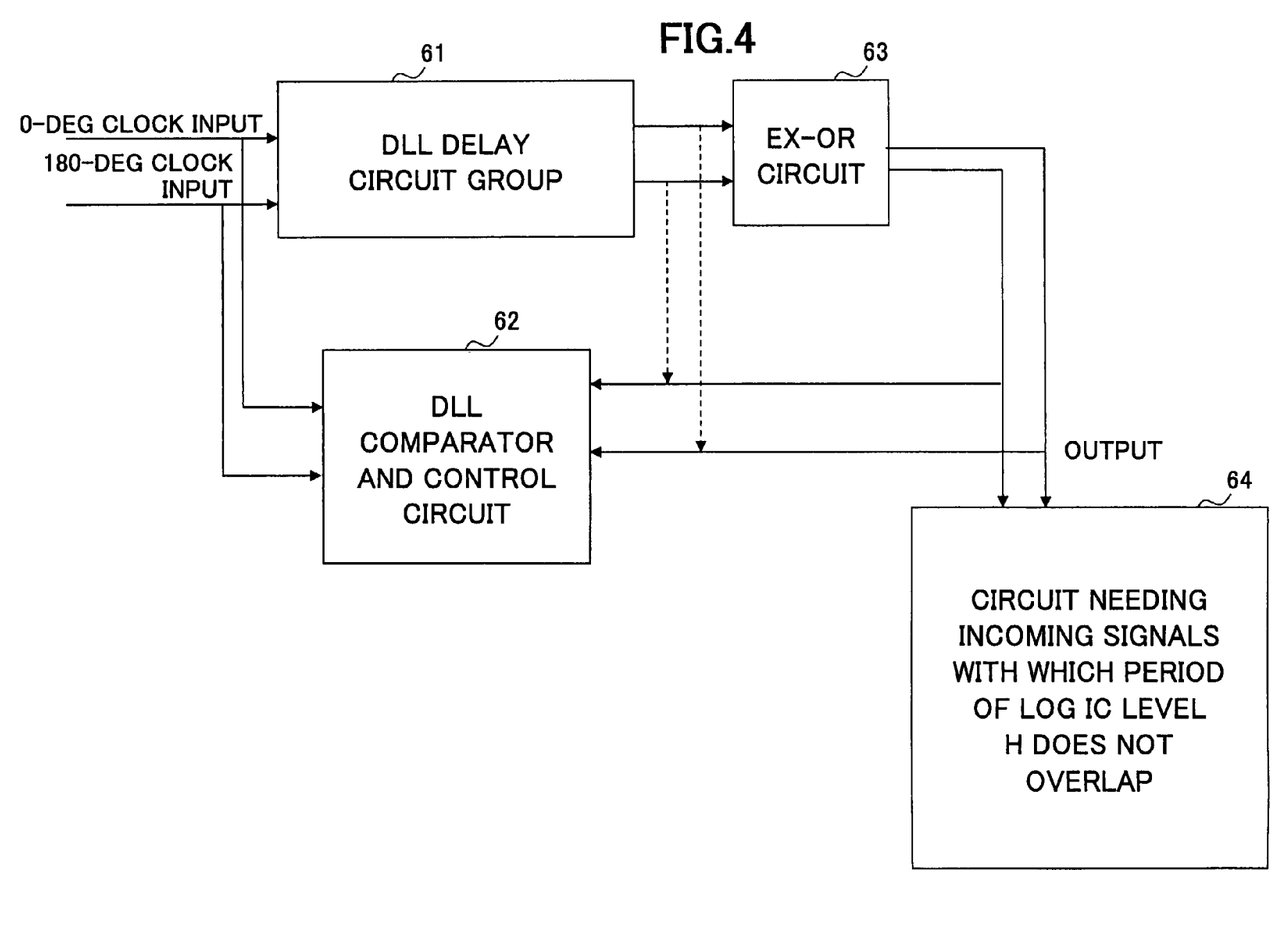
FIG. 4 is a block diagram showing an example of composition of the semiconductor device using the EX-OR circuit in which outputting the first and second signals in which the period of the logic level (H) does not overlap is needed.

FIG. 4 shows an example of composition of the semiconductor device using the EX-OR circuit, which incorporates the circuit which requires receiving the incoming signals in which the period of the logic level (H) does not overlap.

As shown in FIG. 4, the semiconductor device of this embodiment comprises the DLL delay circuit group 61, the DLL comparator and control circuits 62, the EX-OR circuit 63, and the circuit 64 which needs receiving the incoming signals in which the period of the logic level (H) does not overlap.

A description of the circuit 64 which needs receiving the incoming signals in which the period of the logic level (H) does not overlap will be given later with reference to FIG. 5.

In the semiconductor device of FIG. 4, the EX-OR circuit 63 has the circuit configuration that is the same as that of the logical circuit of FIG. 1A, and it is inserted in the circuit configuration including the general DLL circuit.

Figure 5:
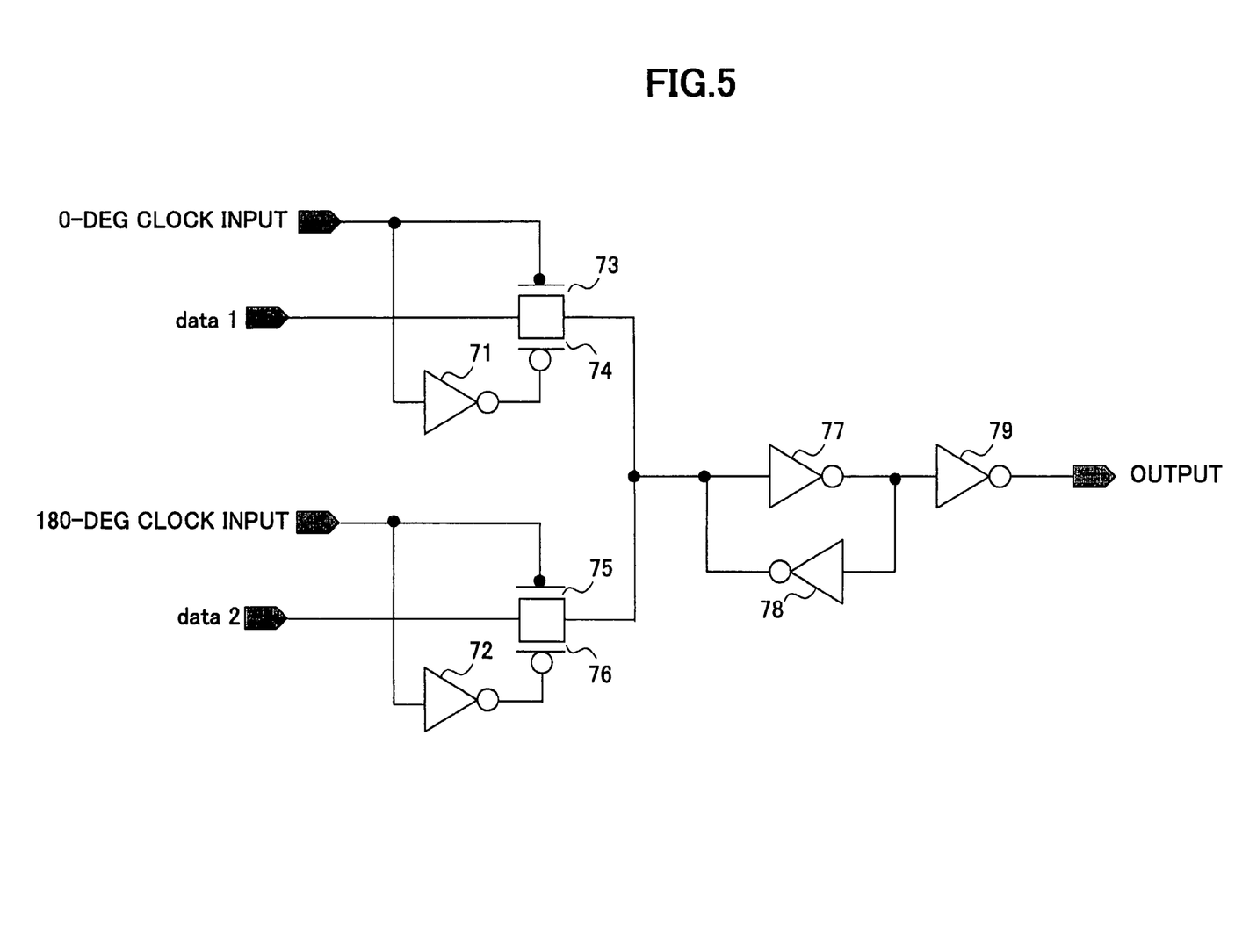
FIG. 5 is a circuit diagram showing an example of the circuit in FIG. 4 in which the signals in which the period of the logic level (H) does not overlap are needed.

FIG. 5 shows an example of the circuit 64 which needs receiving the incoming signals in which the period of the logic level (H) does not overlap, for use in the semiconductor device of FIG. 4.

The outputs of the circuit of FIG. 5 are arranged in the wired-or connection. The circuit of FIG. 5 comprises the inverter 71, the inverter 72, the transistor 73, the transistor 74, the transistor 75, the transistor 76, the inverter 77, the inverter 78, and the inverter 79.

The 0-degree clock signal is inputted to the gate of the transistor 73, and inputted to the input of the inverter 71. The signal which is set by the inversion of the output of the inverter 71 is inputted to the gate of the transistor 74.

The respective source-drain paths of the transistors 73 and 74 are connected with each other, and the data 1 for the 0-degree clock input is inputted to one of the source-drain paths, and it is transmitted to the output terminal of the circuit of FIG. 5 via the other of the source-drain paths.

The 180-degree clock signal is inputted to the gate of the transistor 75, and inputted to the input of the inverter 72. The signal which is set by the inversion of the output of the inverter 72 is inputted to the gate of the transistor 76.

The respective source-drain paths of the transistors 75 and 76 are connected with each other, and the data 2 for the 180-degree clock input is inputted to one of the source-drain paths, and it is transmitted to the output terminal of the circuit of FIG. 5 via the other of the source-drain paths.

In the circuit of FIG. 5, the data bus is divided into two: one for the 0-degree clock input, and the other for the 180-degree clock input.

From the output terminal of the circuit of FIG. 5, the data are serially outputted in accordance with the 0-degree clock signal and the 180-degree clock signal.

Namely, the circuit of FIG. 5 is the parallel-serial conversion circuit which receives the data 1 for the 0-degree clock input and the data 2 for the 180-degree clock input in parallel, and outputs the data serially in accordance with the 0-degree clock signal and the 180-degree clock signal.

In the circuit of FIG. 5, if the 0-degree clock signal and the 180-degree clock signal, which are provided to perform the output control, indicate the logic level (H) simultaneously, the data will collide depending on the state of the data.

For this reason, it is necessary to secure that the logic level (H) of the signals does not overlap, and therefore, the EX-OR circuit 63 is inserted in the semiconductor device as shown in FIG. 4.

However, in the conventional EX-OR circuit 63, the transitional portion of the input clock signal from the logic level (L) to the logic level (H) is deleted in order to secure that the logic level (H) of the signals does not overlap, and even though the clock signals with the phases locked by the DLL circuit are outputted, the deletion of the transitional portion of the input clock signal by the EX-OR circuit 63 will cause the variation of the clock phase to arise.

It is satisfactory if there is no overlapping of the period of the logic level (H) between the input clock signals before being inputted to the EX-OR circuit 63. However, there are some influences, such as the fluctuation of the pulse width of the clock signals in the transmission path of the DLL delay circuit group 61, and the fluctuation of the delay position. Hence, it is difficult to guarantee that the period of the logic level (H) in the input clock signals does not overlap at all.

For this reason, the removal of the clock signal portion will occur in the EX-OR circuit 63, and this will cause the variation of operation of the semiconductor device.

To obviate the problem, by using the logical circuit of FIG. 3 in the semiconductor device of FIG. 4 instead of the EX-OR circuit 63, it is possible that the removal of the transitional portion from the logic level (L) to the logic level (H) of the input signal does not occur, as shown in FIG. 6A, which makes it possible to suppress the variation of operation.

According to the logical circuit of the present invention, it is possible to output the output signals in which the period of the logic level (H) does not overlap, without being influenced by either of the input signals at the time of rising of the counterpart input signal.

By applying the logical circuit of the present invention to the circuit like the DLL circuit in which the timing of rising of the signals is important, it is possible that outputting the signals in which the period of the logic level (H) does not overlap be guaranteed and excessive delay time be shortened, without being influenced due to fluctuation of the input signals at the time of rising of one of the input signals.

Moreover, since the factor which worsens the underflow of the DLL circuit as in the conventional logical circuit does not arise, the logical circuit of the present invention is effective as a logical circuit which outputs the signals in which the period of the logic level (H) does not overlap.

The present invention is not limited to the above-described embodiments, and variations and modifications may be made without departing from the scope of the present invention.

What is claimed is:

1. A logical circuit which receives first and second input signals in which a period of a first logic level partially overlaps, and outputs first and second output signals in which a period of the first logic level does not overlap, the logical circuit comprising:
    a first unit changing a phase of the first output signal from a second logic level to the first logic level when a change of the first input signal from the second logic level to the first logic level is detected; and
    a second unit changing a phase of the second output signal from the first logic level to the second logic level when the second input signal is detected as being at the first logic level at a time of detection of the change of the first input signal.

2. A logical circuit according to claim 1 wherein the phase of the second output signal is changed from the second logic level to the first logic level when a change of the second input signal from the second logic level to the first logic level is detected, and the phase of the first output signal is changed from the first logic level to the second logic level when a chance of the first input signal from the first logic level to the second logic level is detected.

3. A logical circuit according to claim 1 wherein the logical circuit comprises:
    a first output unit which outputs the first output signal;
    a second output unit which outputs the second output signal;
    a first state holding unit which holds, when the phases of the first and second input signals are set to the first logic level simultaneously, a state of the first input signal immediately preceding the setting; and
    a second state holding unit which holds, when the phases of the first and second input signals are set to the first logic level simultaneously, a state of the second input signal immediately preceding the setting;
    wherein the first output unit outputs the first output signal based on the first input signal and information held in the second state holding unit, and the second output unit outputs the second output signal based on the second input signal and information held in the first state holding unit.

4. A logical circuit according to claim 1 wherein the first and second input signals are two clock signals with mutually shifted phases.

5. A semiconductor device comprising:
    a logical circuit which receives first and second input clock signals in which a period of a first logic level partially overlaps, and outputs first and second output clock signals in which a period of the first logic level does not overlap; and a parallel-serial conversion circuit which receives first and second data in parallel and outputs the first and second data serially, the first and second output clock signals from the logical circuit are transmitted to the parallel-serial conversion circuit as clock signals, wherein the logical circuit comprises:

a first unit changing a phase of the first output clock signal from a second logic level to the first logic level when a change of the first input clock signal from the second logic level to the first logic level is detected; and a second unit changing a phase of the second output clock signal from the first logic level to the second logic level when the second input clock signal is detected as being at the first logic level at a time of detection of the change of the first input clock signal.

6. A semiconductor device according to claim 5 wherein the logical circuit is provided so that the phase of the second output clock signal is changed from the second logic level to the first logic level when a change of the second input clock signal from the second logic level to the first logic level is detected, and the phase of the first output clock signal is changed from the first logic level to the second logic level when a change of the first input signal from the first logic level to the second logic level is detected.

7. A semiconductor device according to claim 5 wherein the logical circuit comprises:

a first output unit which outputs the first output clock signal;

a second output unit which outputs the second output clock signal;

a first state holding unit which holds, when the phases of the first and second input clock signals are set to the first logic level simultaneously, a state of the first input clock signal immediately preceding the setting; and a second state holding unit which holds, when the phases of the first and second input clock signals are set to the first logic level simultaneously, a state of the second input clock signal immediately preceding the setting;

wherein the first output unit outputs the first output clock signal based on the first input clock signal and information held in the second state holding unit, and the second output unit outputs the second output clock signal based on the second input clock signal and information held in the first state holding unit.

* * * * *